United States Patent
Lee et al.

(10) Patent No.: US 7,863,152 B2
(45) Date of Patent: Jan. 4, 2011

(54) SEMICONDUCTOR DEVICE STRUCTURE WITH STRAIN LAYER AND METHOD OF FABRICATING THE SEMICONDUCTOR DEVICE STRUCTURE

(75) Inventors: Seung-hwan Lee, Suwon-si (KR); Heon-jong Shin, Yongin-si (KR); Shigenobu Maeda, Seongnam-si (KR); Sung-rey Wi, Suwon-si (KR); Quan WangXiao, Yongin-si (KR); Hyun-min Choi, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 276 days.

(21) Appl. No.: 12/072,445

(22) Filed: Feb. 26, 2008

(65) Prior Publication Data

US 2008/0246092 A1    Oct. 9, 2008

(30) Foreign Application Priority Data

Feb. 27, 2007  (KR) ............... 10-2007-0019880

(51) Int. Cl.
   *H01L 21/762* (2006.01)

(52) U.S. Cl. .................. 438/442; 257/E21.102

(58) Field of Classification Search ............... 438/442; 257/E21.102, E21.092, E21.108, E21.115
See application file for complete search history.

(56) References Cited

U.S. PATENT DOCUMENTS

| 7,057,216 B2 | 6/2006 | Ouyang et al. | |
| 7,554,139 B2* | 6/2009 | Inoue et al. | 257/288 |
| 7,569,443 B2* | 8/2009 | Kavalieros et al. | 438/183 |
| 2002/0168802 A1 | 11/2002 | Hsu et al. | |
| 2006/0228850 A1* | 10/2006 | Tsai et al. | 438/219 |

FOREIGN PATENT DOCUMENTS

KR    2001-0028838    4/2001

* cited by examiner

*Primary Examiner*—Jerome Jackson, Jr.
*Assistant Examiner*—Paul A Budd
(74) *Attorney, Agent, or Firm*—Mills & Onello, LLP

(57) ABSTRACT

A semiconductor device with a strain layer and a method of fabricating the semiconductor device with a strain layer that can reduce a loading effect are provided. By arranging active dummies and gate dummies not to overlap each other, the area of active dummy on which a strain layer dummy will be formed can be secured, thereby reducing the loading effect.

9 Claims, 5 Drawing Sheets

SEMICONDUCTOR DEVICE STRUCTURE WITH STRAIN LAYER AND METHOD OF FABRICATING THE SEMICONDUCTOR DEVICE STRUCTURE

CROSS-REFERENCE TO RELATED PATENT APPLICATION

This application claims the benefit of Korean Patent Application No. 10-2007-0019880, filed on Feb. 27, 2007, in the Korean Intellectual Property Office, the contents of which are incorporated herein in their entirety by reference.

BACKGROUND OF THE INVENTION

1. Field of the Invention

The present invention relates to a semiconductor device structure, and more particularly, to a dummy structure of a semiconductor device, which can increase carrier mobility using a channel strain, and a method of fabricating the semiconductor device structure.

2. Description of the Related Art

As complementary metal oxide semiconductor (CMOS) fabrication processes become finer, methods of increasing carrier mobility are necessary. The best method for increasing carrier mobility is to use a strain layer to apply strain to a channel region. FIG. 1 is a cross-sectional view of a gate structure of a semiconductor device using a channel strain technique. Referring to FIG. 1, silicon germanium (SiGe) layers 3 are formed on both sides of a gate electrode 2. Source/drain regions 4 defined in the silicon substrate 1 are formed under the SiGe layers 3. Because the SiGe layers 3 that are epitaxially grown on the silicon substrate 1 have a larger lattice constant than that of silicon of the silicon substrate 1, the grown siGe layers 3 tend to extend in a lateral direction. Therefore, a channel region (not shown) formed between the SiGe layers 3 experiences compressive stress as indicated by the arrows in the figure. Silicon of the silicon substrate 1 experiencing the compressive stress due to the strain layers, i.e., the siGe layers 3, has a higher carrier mobility than conventionally used silicon, thereby improving the performance of the semiconductor device. In particular, the compressive stress due to the SiGe layers 3 is used to increase hole mobility in a p-channel metal-oxide-semiconductor (PMOS) region.

In the conventional CMOS fabrication processes, however, a loading effect occurs when the SiGe layers 3 are epitaxially grown as the strain layers. The loading effect is a phenomenon where the growth rate of SiGe is different depending on an area of an active region where SiGe will be grown. That is, the growth rate of SiGe is high in an isolation region where patterns having a large active region are formed, while the growth rate of SiGe is low in a dense region where patterns having a small active region are formed. Therefore, thicknesses of the SiGe layers 3 are different due to the difference of the growth rate in the isolation region and the dense region.

FIG. 2 is a cross-sectional view illustrating the thickness difference of the SiGe layers 3a and 3b respectively grown in the isolation region and the dense region. Referring to FIG. 2, the thicknesses of the SiGe layers 3b formed in the dense regions between gate electrodes 2 are less than those of the SiGe layers 3a formed widely in the isolation region. If the thicknesses of the SiGe layers 3a and 3b are different from each other, the degree of compressive stress affecting a channel region is different. Therefore, device characteristics are different in each region, thereby resulting in the degradation of reliability of the semiconductor device.

An active dummy and a gate dummy are used for preventing dishing and erosion when a chemical mechanical polishing (CMP) process is performed for planarization during the formation of an active region and planarization of an inter-layer insulation layer formed on the gate electrodes 2. FIG. 3A is a plan view illustrating the conventional arrangement of active region dummies 1b and gate dummies 2b. FIG. 3B is a cross-sectional view of the active region dummies 1b and the gate dummies 2b. In FIGS. 3A and 3B, an active region 1a and a gate electrode 2a are shown. Referring to FIG. 3A and 3B, the gate dummy 2b overlaps with the active dummy 1b. In this case, a portion of the active dummy 1b is covered by the gate dummy 2b, so that a region where epitaxial SiGe layers can be formed thereon is reduced. Therefore, the loading effect still exists during the growth of the epitaxial. SiGe layers. However, the dishing and erosion problem occurs during the CMP process when the gate dummy 2b is removed so as to expose the top surface of the active dummy 1b. This problem can also occur even though other materials instead of epitaxially grown. SiGe are formed to induce channel strain.

SUMMARY OF THE INVENTION

The present invention provides a semiconductor device using channel strain, which can reduce or remove a loading effect when an epitaxial material layer is formed.

The present invention also provides a method of fabricating a semiconductor device experiencing channel strain, which can reduce or remove a loading effect when an epitaxial material layer is formed.

According to an aspect of the present invention, there is provided a semiconductor device comprising: an active region defined in a semiconductor substrate by a device isolation layer and a plurality of active region dummies defined around the active region; a gate electrode formed on the active region and a plurality of gate dummies exposing the active region dummies; strain layers formed on both sides of the gate electrode formed on the active region, and strain layer dummies formed on the active region dummies; and source/drain regions formed under the strain layers in the active region.

The active region and the active region dummies may be formed in a p-channel metal-oxide-semiconductor (PMOS) region or an n-channel metal-oxide-semiconductor (NMOS) region.

The semiconductor substrate may be a silicon substrate or other material such as silicon carbide.

The strain layers and the strain layer dummies may be formed of a material having a lattice constant different from that of the semiconductor substrate and may be formed using an epitaxial silicon germanium (SiGe) layer.

The active region dummies and the gate dummies may be regularly arranged. Each of the gate dummies may be formed on the device isolation layer. According to another aspect of the present invention, there is provided a method of fabricating a semiconductor device, comprising: defining an active region in a semiconductor substrate by a device isolation layer, and a plurality of active region dummies around the active region; forming a gate electrode on the active region, and a plurality of gate dummies exposing the active region dummies; and forming strain layers on both sides of the gate electrode formed on the active region and the active region dummies.

The forming of the strain layers may comprise: removing the active region exposed on both sides of the gate electrode and the active region dummies by a predetermined depth; and epitaxially growing the strain layer in the resulting active region and active region dummies.

The method may further comprise forming a gate oxide layer before forming the gate electrode.

The active region and the active region dummies may be formed in a PMOS region or an NMOS region.

The semiconductor substrate may be a silicon substrate or other material such as silicon carbide.

The strain layers may be formed of a material having a lattice constant different from that of the semiconductor substrate, and particularly, may be formed of an epitaxial silicon germanium (SiGe) layer.

The active region dummies and the gate dummies may be regularly arranged.

Each of the gate dummies may be formed on the device isolation layer and may be formed of polysilicon.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this description will be thorough and complete, and will fully convey the invention to those skilled in the art.

Figure 1:
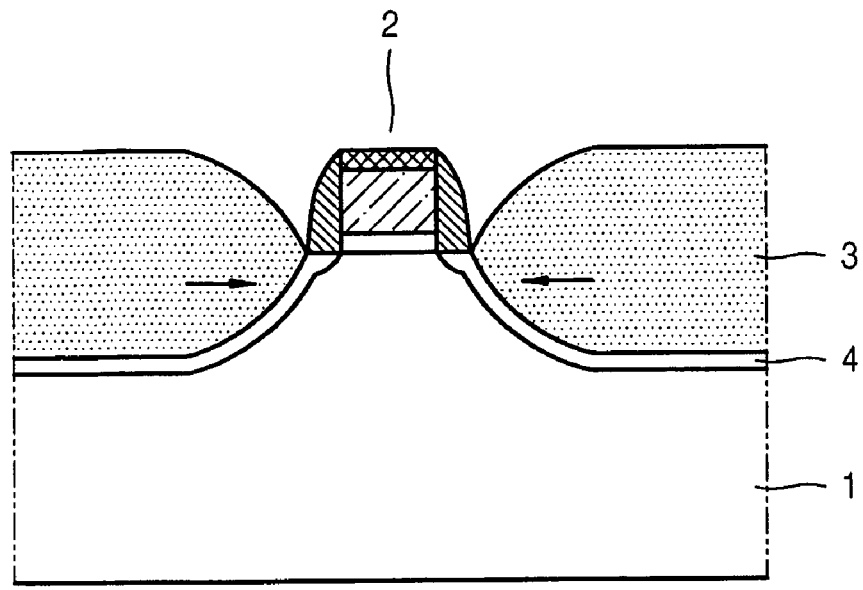
FIG. 1 is a cross-sectional view of a conventional gate structure with a strain layer.
Figure 2:
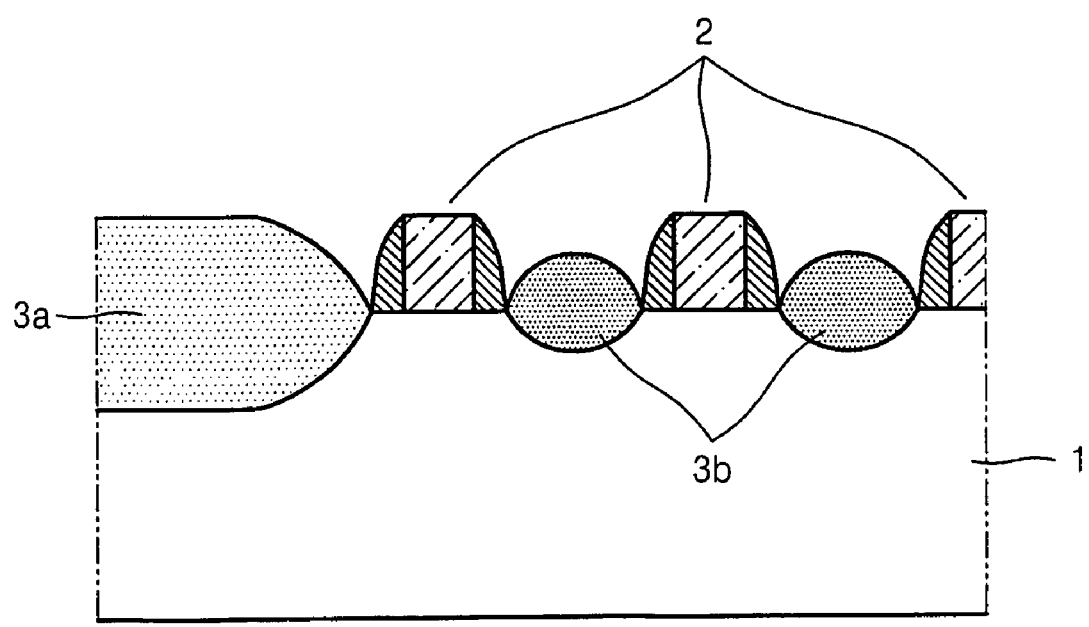
FIG. 2 is a cross-sectional view illustrating the thickness difference of SiGe layers respectively grown in an isolation region and a dense region of a conventional semiconductor device with a strain layer.
Figure 3A:
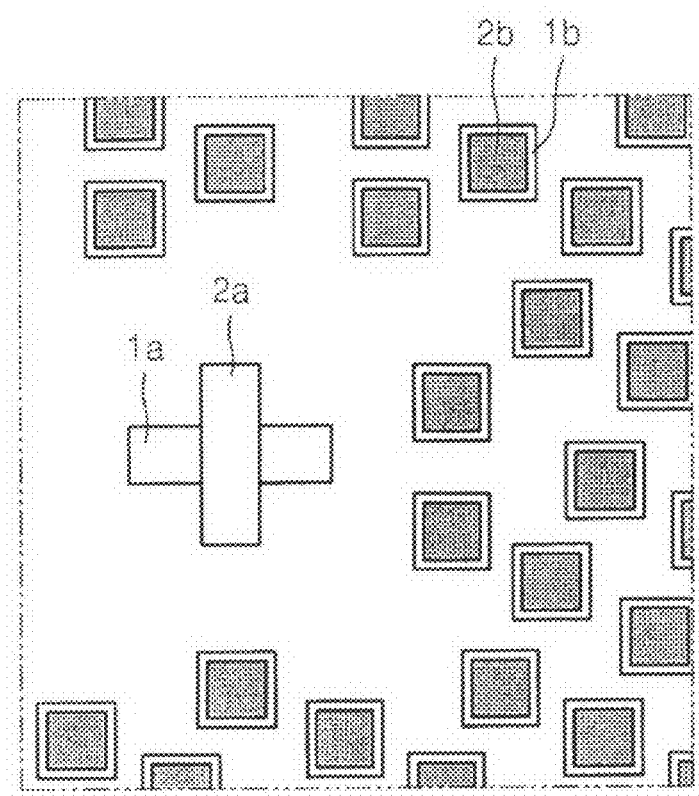
FIG. 3A is a plan view illustrating the arrangement of active region dummies and gate dummies in a conventional semiconductor device with a strain layer.
Figure 3B:
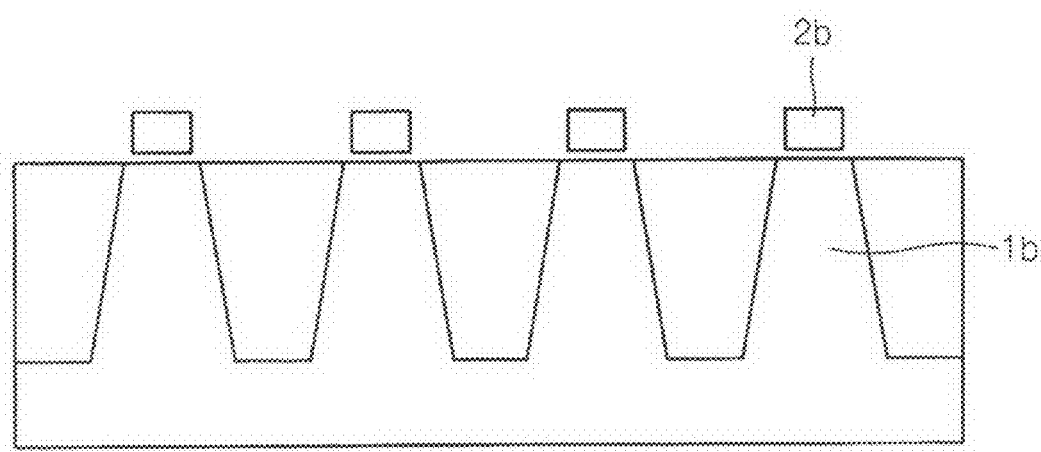
FIG. 3B is a cross-sectional view of the active region dummies and the gate dummies in the conventional semiconductor device of FIG. 3A.
Figure 4:
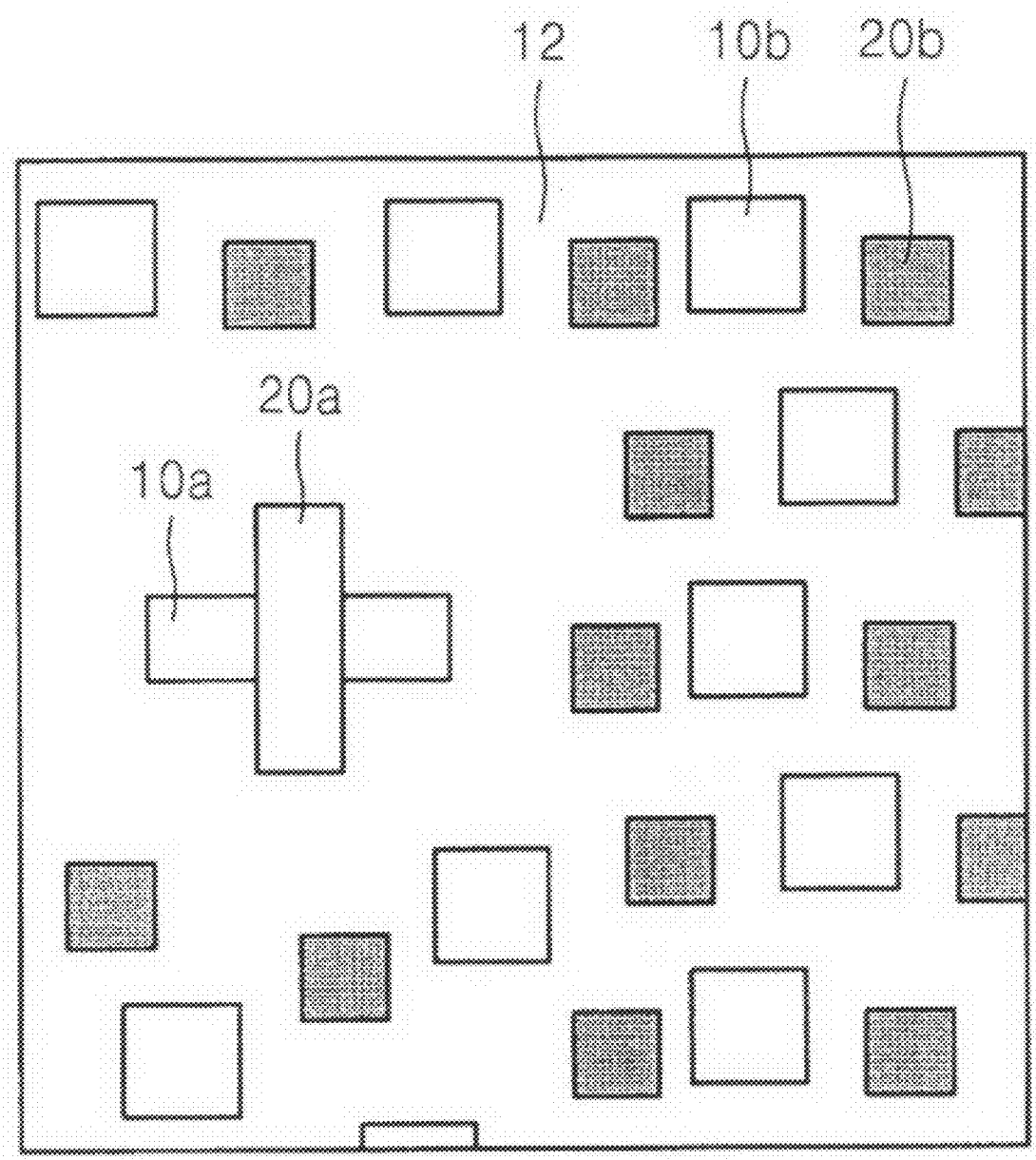
FIG. 4 is a plan view illustrating the arrangement of active region dummies and gate dummies in a semiconductor device with a strain layer according to an embodiment of the present invention.

FIG. 4 is a plan view illustrating the arrangement of a plurality of active region dummies 10b and a plurality of gate dummies 20b in a semiconductor device with a strain layer according to an embodiment of the present invention. Referring to FIG. 4, the active region dummies 10b and the gate dummies 20b surround an isolated active region 10a where a gate electrode 20a is formed. The active region dummies 10b and the gate dummies 20b do not overlap each other as in the conventional art. Hence, the gate dummies 10b are formed on a device isolation layer 12, and thus, not overlapping the active region dummies 10b. Even if the active region dummies 10b and the gate dummies 20b are irregularly arranged on the device isolation layer 12 as shown in FIG. 4, the active region dummies 10b and the gate dummies 20b can also be regularly arranged on the device isolation layer 12. For example, the active region dummies 10b and the gate dummies 20b may be arranged in a matrix form. Although not shown in FIG. 4, a strain layer, that is, a silicon germanium (SiGe) epitaxial layer in the present embodiment, is formed in the active region 10a defined on both sides of the gate electrode 20a and the active dummy 10b. The gate electrode 20a and the gate dummy 20b may be formed of polysilicon.

If the active region dummies 10b are covered by the gate dummies 20b, an area where the SiGe epitaxial layers can be formed around the isolated active region 10a is small, and thus, it is difficult to reduce a loading effect. However, when the top surface of the active region dummies 10b is entirely exposed, the area where the SiGe epitaxial layers can be formed is secured, thereby greatly reducing the loading effect. Hence, the loading effect is greatly reduced by forming the SiGe epitaxial layers in the adjacent active region dummies 10b at the same time when the SiGe epitaxial layers are formed in the isolated active region 10a. Additionally, the gate dummies 20b formed on the device isolation layer 12 can also reduce the dishing and erosion phenomenon when a chemical mechanical polishing (CMP) process is performed on an interlayer insulation layer.

The embodiment of the present invention can be applied to a p-channel metal-oxide-semiconductor (PMOS) region when the strain layers causing the channel strain are formed using the SiGe epitaxial layers due to the fact that a compressive stress applied to a channel region by the SiGe epitaxial layers can improve the carrier mobility of the PMOS device. Even if the SiGe epitaxial layers are used as the strain layers of the PMOS region, the present invention is not limited thereto. Hence, the present invention can be applied to a material having a loading effect and causing channel strain due to a lattice constant that is different from that of the semiconductor substrate. In addition, the present invention can also be applied to an n-channel metal-oxide-semiconductor (NMOS) region when the strain layers are formed of a material that can improve the carrier mobility of the NMOS device and has a loading effect. However, although a silicon substrate is used as the semiconductor substrate, the present invention can also use other materials other than silicon for the semiconductor substrate.

FIGS. 5A through 5D are cross-sectional views illustrating a method of fabricating active region dummies 10b and gate dummies 20b in a semiconductor device with a strain layer according to an embodiment of the present invention. As shown in FIGS. 5A through 5D, a region where an insulated device is formed is defined as a device region, and a region adjacent to the device region is defined as a dummy region.

Figure 5A:
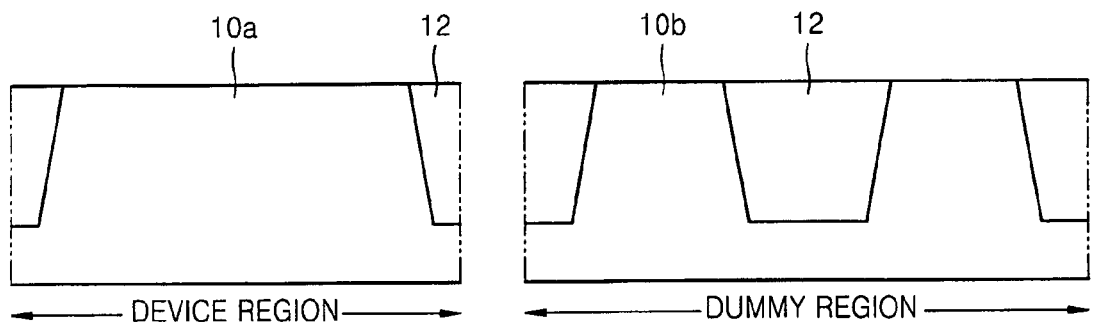
FIGS. 5A through 5D are cross-sectional views illustrating a method of fabricating active region dummies and gate dummies in a semiconductor device with a strain layer according to an embodiment of the present invention.

Referring to FIG. 5A, the active region 10a is formed in a semiconductor substrate and the active dummy 10b is formed around the active region 10a. The isolated active region 10a and the active dummy 10b may be formed by a shallow trench isolation (STI) process. The active dummy 10b can provide a space where a dummy SiGe epitaxial layer will be grown so as to reduce the loading effect when a SiGe epitaxial layer is formed. In addition, the active dummy 10b can prevent the dishing and erosion phenomenon around the isolated active region 10a during a CMP process. The active dummy 10b may be regularly arranged, e.g., in a matrix form.

Figure 5B:
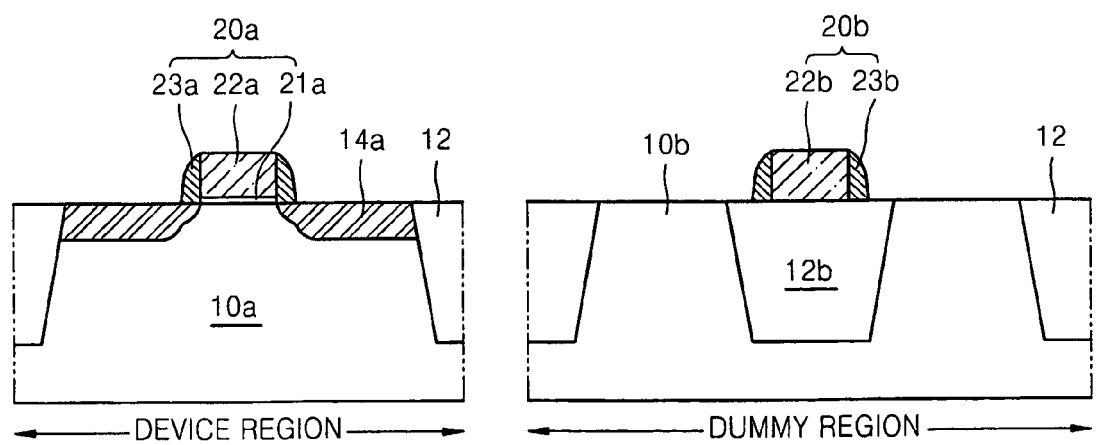

Referring to FIG. 5B, a gate oxide layer 21a is formed in the device region and the gate electrode 20a is formed on the active region 10a. In the dummy region, the gate dummy 20b is formed on the device isolation layer 12 to expose the active dummy 10b. In FIG. 5B, gate conductive layers 22a and 22b and gate spacers 23a and 23b are shown. The gate conductive layers 22a and 22b may be formed of polysilicon. After forming the gate electrode 20a, source/drain regions 14a are formed using ion implantation. The source/drain regions 14a may be formed to have a lightly doped drain (LDD) structure. A space where the dummy SiGe epitaxial layer will be formed can be defined by forming the gate dummy 20b on the device isolation layer 12 to entirely expose the top surface of the active dummy 10b. In another embodiment of the present invention, a degree of exposure of the active dummy 10b can be adjusted by controlling a degree of overlap of the gate dummy 20b and the active dummy 10b. The degree of the loading effect during the growth of the SiGe layer can be adjusted according to the degree of exposure of the active dummy 10b.

Figure 5C:
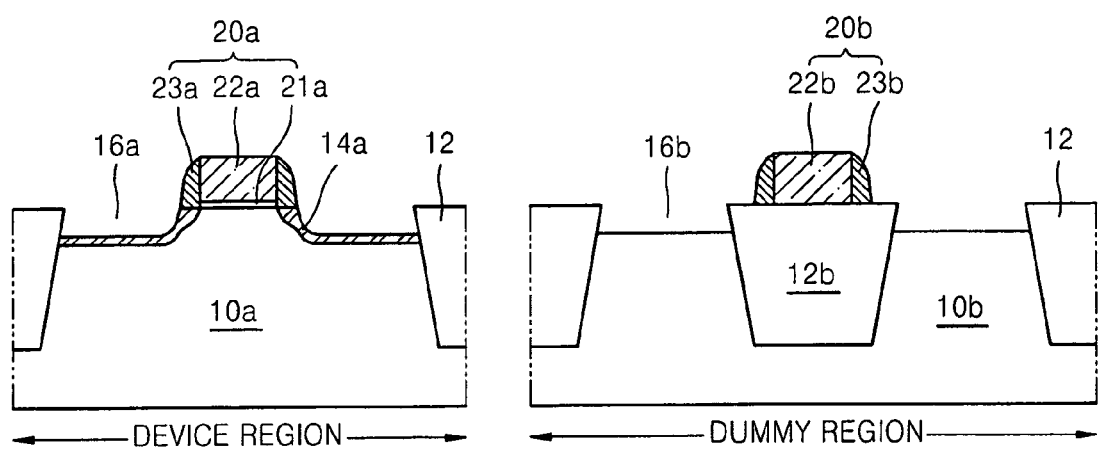

Referring to FIG. 5C, recesses 16a are formed by removing upper surfaces of the source/drain regions 14a, i.e., the active region 10a where the strain layer (the SiGe epitaxial layer in this embodiment) will be formed. At this point, the recesses 16b are also formed in the active dummy 10b.

Figure 5D:
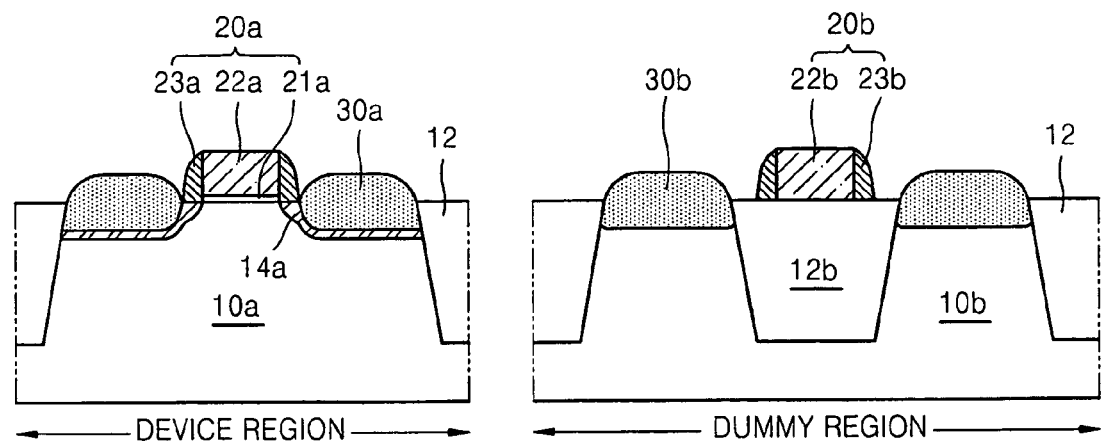

Referring to FIG. 5D, SiGe epitaxial layers 30a and 30b are formed on the recesses 16a of the active region 10a and the active dummy 10b by a selective epitaxial growth. The SiGe epitaxial layer 30a formed on the source/drain regions 14a applies compressive stress to a channel region of the semiconductor substrate. Thus, the carrier mobility is increased and the operating speed of the semiconductor device is increased. In addition, the SiGe epitaxial layer 30b formed on the active dummy 10b can reduce or prevent the loading effect of the SiGe epitaxial layer 30a formed in the isolated active region 10a. The embodiment of the present invention can be applied to a PMOS region when strain layers causing a channel strain are formed using SiGe epitaxial layers. Even if the SiGe epitaxial layers are used as the strain layers of the PMOS region, the present invention is not limited thereto. The present invention can be applied to a material having a loading effect and causing a channel strain due to a lattice constant that is different from that of a semiconductor substrate. In addition, the present invention can also be applied to an NMOS region when the strain layers are formed of a material that can improve the carrier mobility of the NMOS device and has the loading effect. However, even if a silicon substrate is used as the semiconductor substrate, the present invention can also use other materials other than silicon for the semiconductor substrate.

According to the present invention, because an active dummy and a gate dummy are arranged to not overlap with each other, a space for the active dummy where the strain layer dummy will be formed can be secured, thereby reducing or preventing a loading effect during the formation of a strain layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, comprising:
    defining an active region in a semiconductor substrate by a device isolation layer, and a plurality of active region dummies around the active region;
    forming a gate electrode on the active region, and a plurality of gate dummies exposing the active region dummies, wherein each of the gate dummies is formed on the device isolation layer; and
    forming strain layers on both sides of the gate electrode formed on the active region and the active region dummies.

2. The method of claim 1, wherein the forming of the strain layers comprises:
    removing the active region exposed on both sides of the gate electrode and the active region dummies by a predetermined depth; and
    epitaxially growing the strain layer in the resulting active region and active region dummies.

3. The method of claim 1, further comprising forming a gate oxide layer before forming the gate electrode.

4. The method of claim 1, wherein the active region and the active region dummies are formed in a p-channel metal-oxide-semiconductor (PMOS) region.

5. The method of claim 4, wherein the strain layers are formed using an epitaxial silicon germanium (SiGe) layer.

6. The method of claim 1, wherein the semiconductor substrate is a silicon substrate.

7. The method of claim 1, wherein the strain layers are formed of a material having a lattice constant different from that of the semiconductor substrate.

8. The method of claim 1, wherein the active region dummies are regularly arranged.

9. The method of claim 1, wherein each of the gate dummies is formed of polysilicon.

* * * * *